(12) United States Patent
Sakurai

(10) Patent No.: US 10,126,510 B2
(45) Date of Patent: Nov. 13, 2018

(54) DETECTION DEVICE

(71) Applicant: Santec Corporation, Aichi (JP)

(72) Inventor: Yasuki Sakurai, Aichi (JP)

(73) Assignee: Santec Corporation, Aichi (JP)

( * ) Notice: Subject to any disclaimer, the term of this patent is extended or adjusted under 35 U.S.C. 154(b) by 0 days.

(21) Appl. No.: 15/669,010

(22) Filed: Aug. 4, 2017

(65) Prior Publication Data

US 2018/0039030 A1 Feb. 8, 2018

(30) Foreign Application Priority Data

Aug. 5, 2016 (JP) ................................ 2016-154774

(51) Int. Cl.
| | | |
|---|---|---|
| *H04B 14/00* | (2006.01) | |
| *G02B 6/36* | (2006.01) | |
| *G02B 6/42* | (2006.01) | |
| *G02B 6/255* | (2006.01) | |
| *H01L 33/52* | (2010.01) | |
| *H01S 5/022* | (2006.01) | |
| *G02B 6/26* | (2006.01) | |
| *H04B 10/40* | (2013.01) | |
| *H01L 31/0232* | (2014.01) | |
| *G02B 6/38* | (2006.01) | |

(52) U.S. Cl.
CPC ........... *G02B 6/421* (2013.01); *G02B 6/4204* (2013.01); *G02B 6/4248* (2013.01); *H01L 33/52* (2013.01); *H01S 5/02208* (2013.01); *G02B 6/26* (2013.01); *G02B 6/36* (2013.01); *G02B 6/3845* (2013.01); *H01L 31/0232* (2013.01); *H04B 10/40* (2013.01)

(58) Field of Classification Search
CPC .. G02B 6/4204; G02B 6/3845; H04B 10/077; H04B 10/08; G02F 1/01; G02F 1/0147; H04J 14/02; H04J 14/0221
USPC .......................................... 398/25; 385/33, 88
See application file for complete search history.

(56) References Cited

U.S. PATENT DOCUMENTS

| | | | | |
|---|---|---|---|---|
| 5,296,724 A | * | 3/1994 | Ogata ................. | G02B 6/4204 257/680 |
| 6,346,701 B1 | * | 2/2002 | Maruyama ................ | G01J 1/04 250/216 |
| 6,806,547 B2 | * | 10/2004 | Kohmoto ............ | H01L 31/0203 257/433 |
| 7,158,469 B2 | * | 1/2007 | Aikoh ...................... | G11B 7/13 369/120 |
| 2003/0021537 A1 | * | 1/2003 | Qin ...................... | G02B 6/4204 385/48 |
| 2004/0208442 A1 | * | 10/2004 | Shi ......................... | G02B 6/327 385/34 |

(Continued)

*Primary Examiner* — M. R. Sedighian
*Assistant Examiner* — Abbas H Alagheband
(74) *Attorney, Agent, or Firm* — Osha Liang LLP

(57) ABSTRACT

A detection device is provided with a holding body that holds a light-receiving module, an optical fiber pigtail, and a lens. The light-receiving module is provided with a light-receiving element and a stem that supports the light-receiving element. The lens collimates an input light from one end of an input fiber and guides a portion of the input light to the light-receiving element. The lens separates the input light into a transmitted light and a reflected light, guiding the transmitted light to the light-receiving element and guiding the reflected light to an output fiber. The light-receiving element has a center of a light-receiving surface thereof disposed in a position away from an axis of the stem.

8 Claims, 5 Drawing Sheets

(56) References Cited

U.S. PATENT DOCUMENTS

| | | | | |
|---|---|---|---|---|
| 2005/0280888 A1* | 12/2005 | Pan | ................. | G02B 6/4201 359/337 |
| 2006/0158718 A1* | 7/2006 | Pan | ................. | G02B 6/4201 359/341.1 |
| 2006/0239605 A1* | 10/2006 | Palen | ................. | G02B 6/4206 385/14 |
| 2007/0183716 A1* | 8/2007 | Suzuki | ................. | G02B 6/262 385/33 |
| 2007/0196057 A1* | 8/2007 | Suzuki | ................. | G02B 6/4204 385/88 |
| 2008/0044135 A1* | 2/2008 | Furuichi | ................. | G02B 6/327 385/34 |
| 2009/0045407 A1* | 2/2009 | Nagasaki | ................. | H01L 27/14603 257/72 |
| 2010/0053394 A1* | 3/2010 | Kinoshita | ................. | G03B 17/00 348/294 |
| 2010/0148041 A1* | 6/2010 | Takamatsu | ................. | G02B 6/4203 250/227.24 |
| 2011/0089314 A1* | 4/2011 | Yang | ................. | G02B 6/4207 250/227.2 |
| 2011/0291144 A1* | 12/2011 | Yoshida | ................. | G02B 6/4204 257/98 |
| 2012/0148191 A1* | 6/2012 | Lee | ................. | G02B 6/4207 385/33 |
| 2012/0177321 A1* | 7/2012 | Kuwahara | ................. | G02B 6/4206 385/35 |
| 2013/0161497 A1* | 6/2013 | Sasada | ................. | G02B 6/4206 250/227.23 |
| 2015/0226679 A1* | 8/2015 | Uno | ................. | G01K 11/32 702/182 |
| 2016/0020577 A1* | 1/2016 | Sakai | ................. | H01S 5/02212 362/259 |
| 2018/0026426 A1* | 1/2018 | Kawakita | ................. | G02B 5/284 372/20 |

* cited by examiner

DETECTION DEVICE

FIELD

The present disclosure relates to a device for detecting a power of a light.

BACKGROUND

To monitor an optical communication operation in an optical communication network, the optical communication network is provided with an optical power monitor (for example, see patent literature 1). The optical power monitor is, for example, built into an optical communication device, detects a power of an optical communication signal, and provides information on the detected power to a controller in the optical communication device.

Included as one example of the optical communication network is a WDM (wavelength-division multiplexing) network. At a branching point of the WDM network, for example, as the optical communication device, a ROADM device is disposed. The ROADM device is provided with an optical switch for switching the optical communication signal to any path and/or branching/inserting the optical communication signal. The optical power monitor is, for example, mounted to this ROADM device and is used to control an optical amplifier in the ROADM device and transmit the optical communication signal at an optimal power. Additionally, the optical power monitor is also used in an optical communication device such as an optical transceiver or an optical transponder that sends/receives an optical communication signal to control and/or monitor the optical communication signal.

CITATION LIST

Patent Literature

[Patent Literature 1] US2003/0021537 A1

The optical communication device described above has a high need for multiporting and size reduction. Similarly, the optical power monitor also has a high need for size reduction. However, in a configuration of a conventional optical power monitor, there is a limit to size reduction due to a size of a light-receiving portion, which includes electrical elements—for example, a size of a PD module including a photodiode (PD).

SUMMARY

One or more embodiments of the present invention provide a device that can be reduced in size as a device for detecting a power of a light.

A detection device according to one aspect of the present disclosure is a detection device for detecting a power of an input light and is provided with a light-receiving module, an optical fiber pigtail, a lens, and a tubular holding body.

The light-receiving module is provided with a light-receiving element and a stem that supports the light-receiving element. The stem is configured to form a signal line from the light-receiving element. The optical fiber pigtail is provided with two optical fibers, connected to an optical transmission line, and a capillary supporting one end of the two optical fibers and is made to be of a configuration where one end of the two optical fibers is supported along an axis of the capillary.

The lens is configured to collimate the input light from one end of an input fiber, which is one of the two optical fibers, and guide a portion of the input light to the light-receiving element. This lens is configured to separate the input light into a transmitted light and a reflected light, guiding the transmitted light to the light-receiving element and guiding the reflected light to an output fiber, which is the other of the two optical fibers. The lens can be made to be of a configuration where, for example, had on a surface opposing the light-receiving element is a branching membrane that separates the input light into the transmitted light and the reflected light.

The holding body is configured to hold the light-receiving module, the optical fiber pigtail, and the lens. In this detection device, the light-receiving element has a center of a light-receiving surface thereof disposed in a position away from an axis of the stem and outputs an electrical signal according to a power of the input light received in this position.

The configuration of the light-receiving module where the light-receiving element is away from the axis of the stem enables greater size reduction of the detection device than a configuration of the light-receiving module where the light-receiving element is disposed at a center of the stem aligned with the axis of the stem. The light-receiving module, which includes electrical elements, is harder to reduce in size than the optical fiber pigtail and the lens. Therefore, a size of the holding body is greatly affected by a size and disposition of the light-receiving module.

Meanwhile, in a detection device provided with an input fiber and an output fiber, so a returning light from the output fiber is not received by the light-receiving element, the light-receiving element is disposed in a position away from an extension line of the axis of the capillary and the input light from the input fiber is guided so as to be received by the light-receiving element in this separated position.

That is, in a situation where the light-receiving element is disposed centrally and aligned with the axis of the stem, the light-receiving element is disposed in a position away from the axis of the capillary; therefore, the axis of the stem needs to be disposed in a position away from the axis of the capillary. However, because the stem has a comparatively large diameter, the more the axis of the stem moves away from the axis of the capillary, the greater of a diameter of the holding body is needed; as a result, an outer diameter of the detection device cannot be made small.

In contrast, according to a configuration where the light-receiving element is disposed in a position away from the axis of the stem, the light-receiving module, the optic fiber pigtail, and the lens can be held by aligning the axis of the stem with the axis of the capillary or suppressing a shift amount of the axis of the stem from the axis of the capillary to be small. As a result, according to one aspect of the present disclosure, the outer diameter of the detection device can be made small.

For size reduction of the detection device, the light-receiving module, the optic fiber pigtail, and the lens can be arranged on the same centerline. In this situation, the light-receiving element can have the center of the light-receiving surface thereof disposed in a position away from the axis of the stem, which is aligned with this centerline. This arrangement and disposition contributes to further size reduction of the detection device.

According to one aspect of the present disclosure, the light-receiving element may have the center of the light-receiving surface disposed in a position overlapping a center of the input light. According to this disposition, the light-receiving element can efficiently receive the input light and a detection precision of the power improves.

According to one aspect of the present disclosure, the light-receiving module can be no less than a diameter of the optical fiber pigtail and the lens. An advantage of size reduction based on the configuration described above increases in a detection device where the light-receiving module is no less than the diameter of the optical fiber pigtail and the lens. However, with the detection device according to one aspect of the present disclosure, the light-receiving module is not limited to a form of being no less than the diameter of the optical fiber pigtail and the lens. Were the light-receiving element to be disposed at the center of the stem, in a situation where the light-receiving module protrudes more to a radial-direction outer side than the other components, when the configuration described above according to the present disclosure is adopted, in a situation where this protrusion amount can be made to be zero or small, the configuration described above according to the present disclosure is significant.

In one aspect of the present disclosure, the light-receiving module may be made to be of a configuration where an electrode pin penetrating the stem is had, a light-receiving element in the form of a chip is mounted to this electrode pin on a front surface of the stem, and this light-receiving element is covered by a potting material. This configuration contributes to size reduction of the light-receiving module. The light-receiving module may be made to be a configuration where a light-receiving element in the form of a chip is mounted on a substrate for front-surface-mounting. Included as an example of the light-receiving element is a photodiode, and included as an example of the light-receiving element in the form of a chip is a photodiode chip.

DETAILED DESCRIPTION

Figure 1:
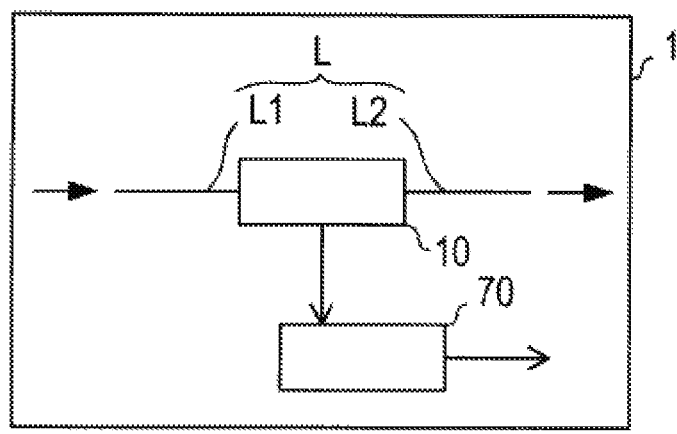
FIG. 1 A block diagram representing a schematic configuration of an optical communication device including a photodetector according to one or more embodiments.

Illustrative embodiments of the present invention are described below together with the drawings. An optical communication device 1 of one or more embodiments illustrated in FIG. 1 is provided with a tapped photodetector 10 connected to an optical transmission line L. In FIG. 1, an optical communication device 1 provided with a single photodetector 10 is illustrated. However, the optical communication device 1 may be a multiport communication device and may be made to be of a configuration where a photodetector 10 is provided to each transmission line at the ports. The optical communication device 1 can be any device from among, for example, a sending device, a receiving device, and a relay device in an optical communication network. The optical communication device 1 may be a management/monitoring device connected to the optical communication network for management and/or monitoring purposes.

The photodetector 10 detects a power of an input light from the optical transmission line L and inputs to a controller 70 in the optical communication device 1 an electrical signal according to this power as a detection signal. The input light can be any signal from among an optical communication signal received by the optical communication device 1 from an external device, an optical communication signal sent by the optical communication device 1 to an external device, and a transfer signal in a situation where the optical communication device 1 is a repeater such as a ROADM device.

Figure 2:
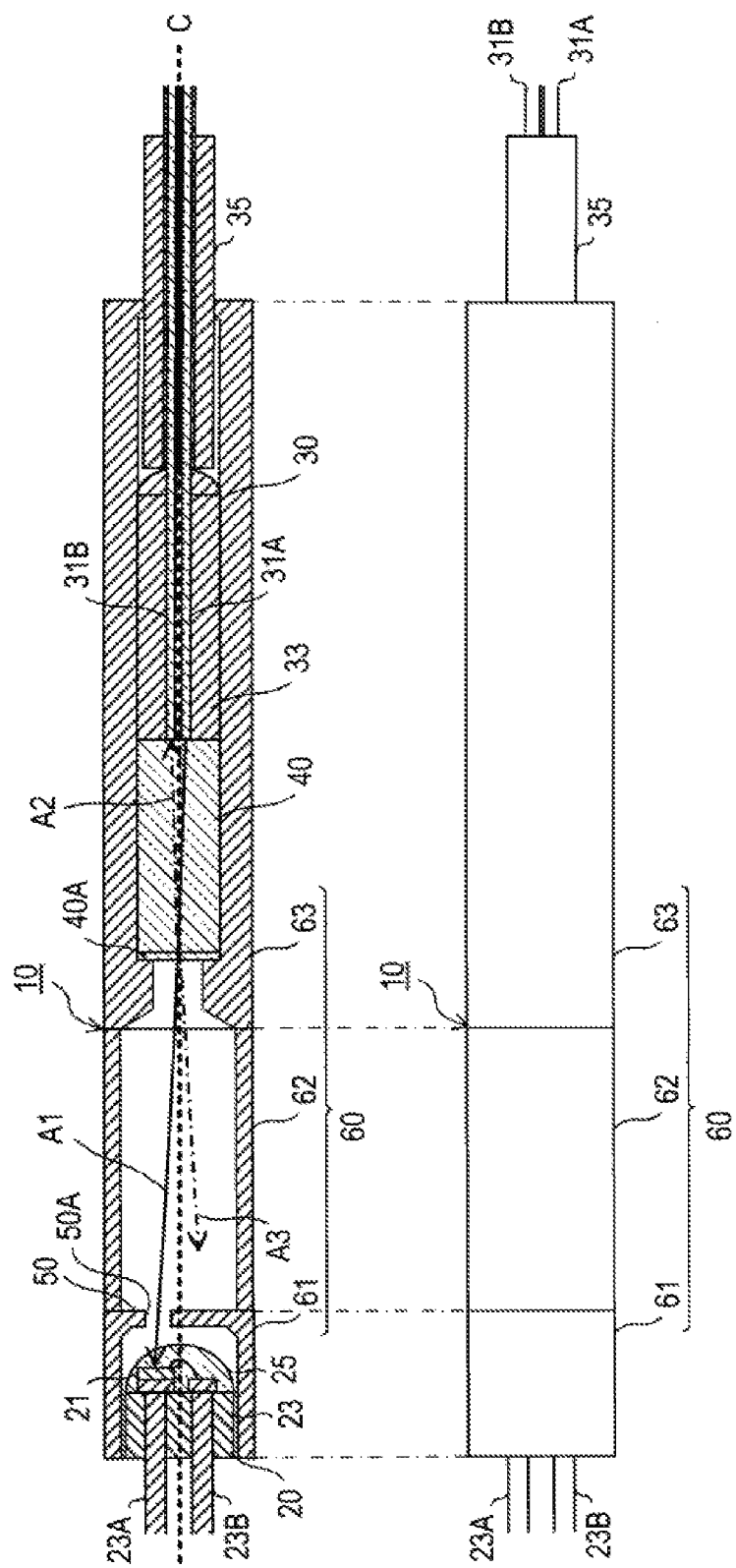
FIG. 2 A diagram illustrating above a cross-sectional structure at a centerline of the photodetector and below a schematic configuration of the photodetector illustrating an external form of the photodetector according to one or more embodiments.

The photodetector 10 is configured, for example, as illustrated in FIG. 2. The photodetector 10 illustrated in FIG. 2 is principally provided with a PD module 20, an optical fiber pigtail 30, a GRIN lens 40, and a tubular case 60 that holds these. This photodetector 10 is made to be of a configuration where respective axes of the PD module 20, the optical fiber pigtail 30, and the GRIN lens 40 are aligned with an axis of the tubular case 60 and disposed lined up on the same centerline C.

Figure 3:
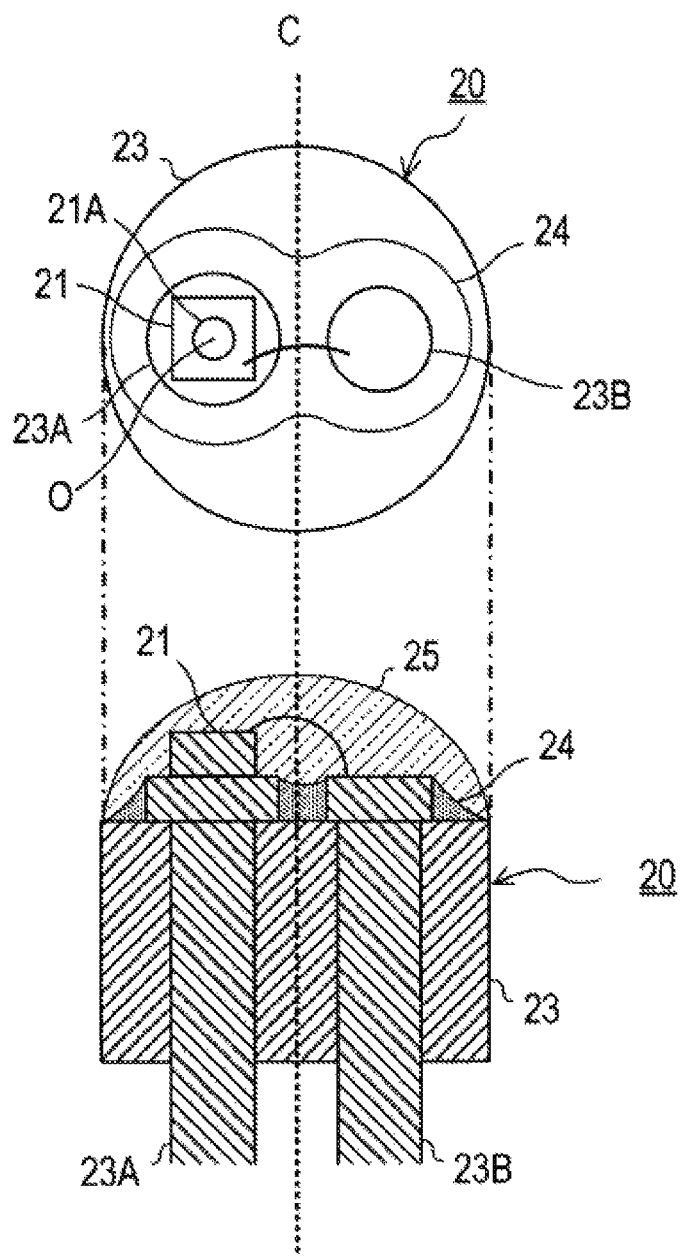
FIG. 3 A diagram representing a schematic configuration of a PD module where had above is a plan view of the PD module and had below is a cross-sectional view at a centerline of the PD module according to one or more embodiments.

As illustrated in FIG. 3, the PD module 20 is provided with a photodiode (PD) chip 21 as a light-receiving element, a cylindrical stem 23 that supports the PD chip 21, and a transparent resin layer 25 that covers and protects the PD chip 21. The stem 23 is provided with a pair of conductive electrode pins 23A, 23B penetrating the stem 23 from a front surface thereof to a rear surface thereof. Hermetically-sealing glass 24 is provided around the electrode pints 23A, 23B of the stem 23.

A top portion of the electrode pin 23A has the PD chip 21 mounted thereon, and a top portion of the electrode pin 23B is wire-bonded to the PD chip 21. Specifically, the electrode pin 23A is electrically connected to a cathode electrode formed on a rear surface of the PD chip 21, and the electrode pin 23B is electrically connected to an anode electrode formed on a front surface of the PD chip 21. That is, the electrode pins 23A, 23B function as lead lines from the PD chip 21 and function as a feeder to the PD chip 21 and a signal line from the PD chip 21.

These electrode pins 23A, 23B are connected to the controller 70. The controller 70 executes predetermined processing based on the detection signal of the power input from the PD chip 21 via these electrode pins 23A, 23B. Included as examples of the processing are processing that adjusts a gain of an optical amplifier and processing that displays a detection value of the power.

Figure 4:
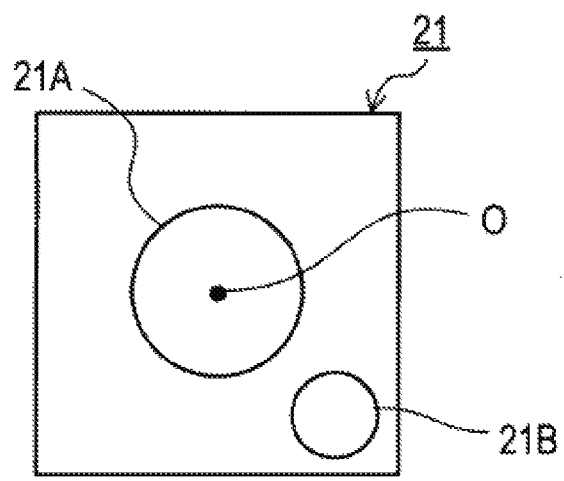
FIG. 4 A top view representing a schematic configuration of a front surface of a PD chip according to one or more embodiments.

As illustrated in FIG. 4, the PD chip 21 has a circular light-receiving surface 21A in a front-surface central portion facing a GRIN-lens 40 side and is provided with an anode electrode 21B in a corner portion of the front surface thereof. The PD chip 21 is provided with a cathode electrode, which is not illustrated, on the rear surface thereof. This PD chip 21 inputs to the controller 70 the electrical signal according to a received light quantity (received optical power) at the light-receiving surface 21A as the detection signal via the electrode pins 23A, 23B of the stem 23.

Furthermore, the transparent resin layer 25 is formed by potting. That is, the transparent resin layer 25 is formed by a potting material being coated and cured on the stem 23 and the PD chip 21 in a state where the PD chip 21 is mounted on the electrode pin 23A in the stem 23.

Additionally, the optical fiber pigtail 30 is provided with two optical fibers 31A, 31B connected to the optical transmission line L; a cylindrical two-core capillary 33 wherein the optical fibers 31A, 31B are inserted; and a loose tube 35 that protects the optical fibers 31A, 31B.

In the capillary 33, the optical fibers 31A, 31B are disposed in parallel along an axis of the capillary 33. Specifically, the optical fibers 31A, 31B are disposed in parallel slightly away from each other in opposing directions from a center of the capillary 33. The two-core capillary 33 supports one end of the optical fibers 31A, 31B disposed in this manner A diameter of the capillary can be, for example, 1 mm.

The optical fiber 31A, which is one of these two optical fibers 31A, 31B, is used as an input fiber 31A for inputting the optical communication signal whose power is to be detected by the photodetector 10. The other optical fiber 31B is used as an output fiber 31B for returning the optical communication signal to the optical transmission line L.

An end portion on an opposite side of the end portion supported by the capillary 33 of the optical fibers 31A, 31B is connected to the optical transmission line L via a connector that is not illustrated. Specifically, the input fiber 31A is connected, within the optical transmission line L, to an optical transmission line L1 positioned upstream, in a transmission direction, of the photodetector 10 and the output fiber 31B is connected, within the optical transmission line L, to an optical transmission line L2 positioned downstream, in the transmission direction, of the photodetector 10.

The GRIN lens 40 is provided adjacent to the capillary 33 and on the same centerline C as the capillary 33. That is, an axis of the GRIN lens 40 is positioned on the same centerline C as the axis of the capillary 33. The light from the input optical fiber 31A supported by the capillary 33 is input to the GRIN lens 40 disposed in this manner The GRIN lens 40 is configured to collimate the input light and guide this collimated light to the light-receiving surface 21A of the PD module 20. The GRIN lens 40 is configured, for example, as a lens of the same diameter as the capillary 33—specifically, a lens of a diameter of 1 mm.

The GRIN lens 40 has a branching membrane 40A on an end surface facing a light-receiving-surface 21A side of the PD module 20. The branching membrane 40A separates the light from the input fiber 31A arriving via a main body of the GRIN lens 40 into a transmitted light and a reflected light. As the branching membrane 40A, a branching membrane is selected where a light-quantity ratio between transmitted light and reflected light becomes a predetermined ratio. A ratio of the transmitted light is, for example, no more than 1% of the input light.

By being provided with this branching membrane 40A, the GRIN lens 40 guides a portion of the input light from the input fiber 31A (transmitted light) to the light-receiving surface 21A of the PD module 20. Moreover, the GRIN lens 40 guides a reflected-light component of the input light separated by the branching membrane 40A to the output fiber 31B. The reflected-light component is condensed in a path in the GRIN lens 40 leading to the output fiber 31B and is input to the output fiber 31B.

Arrow A1 illustrated by a solid line in FIG. 2 schematically illustrates a path of the transmitted light, propagated to the light-receiving surface 21A, among the input light from the input fiber 31A. Arrow A2 illustrated by a dot-dash line in FIG. 2 schematically illustrates a path of the reflected light from the branching membrane 40A. Arrow A3 illustrated by a dot-dash line in FIG. 2 illustrates a returning light of the reflected light. A portion of the reflected light is not propagated downstream on the optical transmission line L via the output fiber 31B but is propagated, as the returning light, from the GRIN lens 40 to airspace on a PD-module 20 side.

With the photodetector 10, to suppress this returning light from reaching the light-receiving surface 21A, the PD module 20 is disposed at a certain interval from the GRIN lens 40. By the PD module 20 and the GRIN lens 40 being separated, on the PD-module 20 side, a certain distance is provided between the proper transmitted light and the returning light. Because of this, the PD module 20 can selectively receive the proper transmitted light at the light-receiving surface 21A. The proper transmitted light referred to here refers to the transmitted light from the branching membrane 40A of the input light intentionally guided to the light-receiving surface 21A that is not the returning light or other stray light.

Furthermore, to suppress the returning light and the other stray light from being received at the light-receiving surface 21A, an aperture wall 50 having an opening portion 50A is provided between the GRIN lens 40 and the PD module 20. This opening portion 50A of the aperture wall 50 is provided in a position corresponding to a normal optical path of the transmitted light and suppresses light not arriving from the normal optical path of the transmitted light from being received at the light-receiving surface 21A.

Furthermore, the tubular case 60 holding therein the PD module 20, the optical fiber pigtail 30, and the GRIN lens 40 is configured by linking a first component 61, a second component 62, and a third component 63. The first component 61 holds therein the optical fiber pigtail 30 and the GRIN lens 40. The second component 62 disposes the GRIN lens 40 and the PD module 20 at a predetermined interval from each other and functions as a component that forms within this space a propagation path of the transmitted light. The third component 63 is configured integrally with the aperture wall 50 and holds therein the PD module 20.

By combining the first component 61, the second component 62, and the third component 63, the tubular case 60 is configured as a storage body and a holding body that stores and holds the PD module 20, the optical fiber pigtail 30, and the GRIN lens 40. The first component 61, the second component 62, and the third component 63 each have the same outer diameter, this outer diameter being, for example, 1.8 mm. In the tubular case 60 having this outer diameter, a PD module 20 of a diameter (outermost diameter) of, for example, 1.3 mm is disposed.

Next, a characteristic configuration had by the photodetector 10 of one or more embodiments is detailed. According to one or more embodiments, the PD chip 21 is disposed in a position away from the axis of the stem 23. Specifically, the PD chip 21 has a center thereof and a center 0 of the light-receiving surface 21A disposed in positions away from the axis of the stem 23 and is configured to output an electrical signal according to a power of the input light received in this position as the detection signal. The axis of the stem 23 matches an axis of the PD module 20 in one or more embodiments and is disposed in the tubular case 60 on the same centerline C as the optical fiber pigtail 30 and the GRIN lens 40. In such a disposition, the PD chip 21 is disposed in a position where a center of the light receiving surface 21A overlaps a center of the input light (proper transmitted light).

According to one example, the PD module 20 is a PD module 20 whose outermost diameter is 1.3 mm and is provided with a stem 23 having a diameter of 1.3 mm. In this stem 23, each of the electrode pins 23A, 23B is disposed so each centerline of the electrode pins 23A, 23B is 0.28 mm away from the axis of the stem 23. Therefore, the electrode pins 23A, 23B are disposed so as to be 0.56 mm away from each other interposing the axis of the stem 23. According to one example, the top portion of the electrode pin 23A has a flat surface of a diameter of no less than 0.3 mm for the PD chip 21 to be mounted thereon; mounted thereon is a square or rectangular PD chip 21 where the length of one side is 0.27 mm to 0.29 mm. The PD chip 21 is made to be of a configuration having, for example, a light-receiving surface 21A of a diameter of 100 µm in a central portion thereof.

Figure 7:
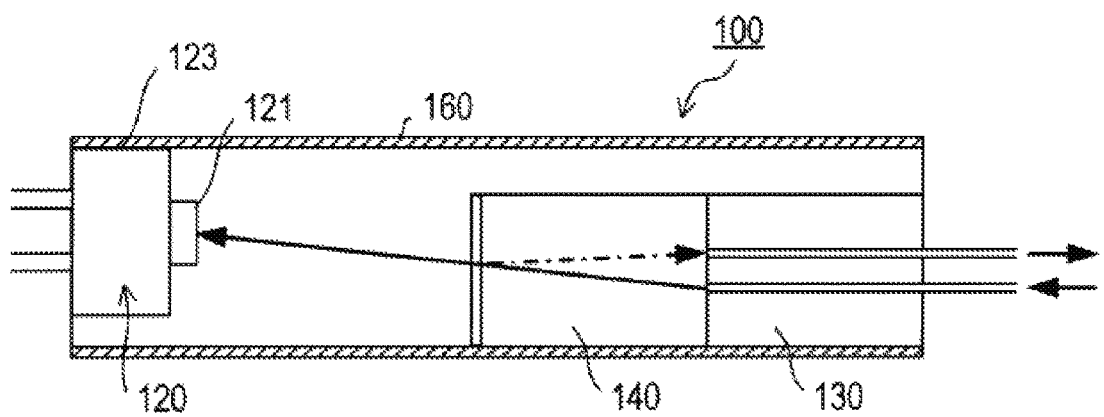
FIG. 7 A diagram representing a configuration of a photodetector of a comparative example.

According to this configuration of the PD module 20, compared to a configuration of a photodetector 100 illustrated in FIG. 7 where the PD chip 21 is disposed centrally and aligned with the axis of the stem 23, the PD module 20, the optical fiber pigtail 30, and the GRIN lens 40 can be housed efficiently in the tubular case 60, which enables a diameter of the tubular case 60 to be reduced. Therefore, according to this configuration of the PD module 20, a small photodetector 10 can be configured.

Because the photodetector 100 illustrated in FIG. 7 has a PD module 120 where a PD chip 121 is disposed centrally and aligned with an axis of a stem 123, to align a center of a light-receiving surface of the PD chip 121 with the center of the input light, axes of the PD module 120 and the stem 123 thereof cannot be disposed on the same centerline as a GRIN lens 140 and an optical fiber pigtail 130. Moreover, because size reduction of the PD modules 20, 120 is more difficult that size reduction of the optical fiber pigtails 30, 130 and the GRIN lenses 40, 140, diameters of the PD modules 20, 120 are normally no less than those of the optical fiber pigtails 30, 130 and the GRIN lenses 40, 140. Because of this, an area of a projection of the PD module 120, the optical fiber pigtail 130, and the GRIN lens 140 in an axial direction of the tubular case 160 becomes larger than that of the photodetector 10 of one or more embodiments above.

Therefore, in this photodetector 100, unless a diameter of the case 160 is made greater than that of the photodetector 10 of one or more embodiments above, the PD module 120, the optical fiber pigtail 130, and the GRIN lens 140 cannot be housed in the case 160.

In contrast, according to the photodetector 10 of one or more embodiments, wasteful space such as that seen in the photodetector 100 in FIG. 7 can be reduced. Therefore, according to the configuration of the photodetector 10 of one or more embodiments, the photodetector can be configured to be small.

Described above is an example of a photodetector 10 provided with a PD module 20 of an outermost diameter of 1.3 mm. However, the outermost diameter of the PD module 20 is not limited thereto. For example, the outermost diameter of the PD module 20 may be no more than 1.3 mm or greater than 1.3 mm. Taking into consideration use of a high-speed optical communication network and size reduction for the optical communication device 1, a outermost diameter of the PD module 20 in one or more embodiments may be no more than about 2.45 mm.

As the GRIN lens 140, a lens of a diameter of 1.8 mm that is widespread together with a lens of a diameter of 1 mm may be used. Taking into consideration size reduction for the optical communication device 1, for handling of the optical fibers 31A, 31B in the optical communication device 1, it is possible for the photodetector 10 to adopt an optical fiber with a small bending radius as the optical fibers 31A, 31B.

As a widespread optical fiber, an optical fiber with a bend radius of 30 mm is known. However, for the handling above, as the optical fibers 31A, 31B, it is possible to use an optical fiber with a bend radius of no more than 10 mm, and an optical fiber with a bending radius of no more than 5 mm may also be used. Taking into consideration size reduction for the optical communication device 1, it is possible to use an optical fiber with a cladding outer diameter of no more than 125 µm in the photodetector 10, and an optical fiber with a cladding outer diameter of no more than 80 µm may also be used.

In one or more embodiments above, adopted is a PD module 20 where the PD chip 21 is mounted on the electrode pin 23A exposed on the front surface of the stem 23 and the PD chip 21 is covered by the potting material, but the photodetector 10 may be mounted with a light-receiving module of another structure instead of the PD module 20 above.

[First Modified Example]

Figure 5:
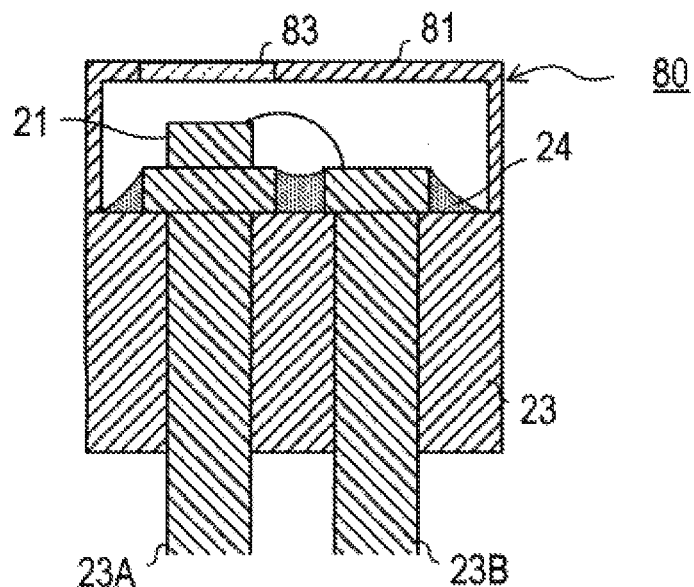
FIG. 5 A cross-sectional view representing a schematic configuration of a PD module of a first modified example.

In the photodetector 10, instead of the PD module 20, a PD module 80 of a TO (CAN) type illustrated in FIG. 5 may be mounted. The PD module 80 is made to be of a configuration where the PD chip 21 is covered by a metal case 81 instead of the potting material. The metal case 81 has an opening portion in the path of the input light to the PD chip 21, and the opening portion is sealed by a transparent material 83. The disposition of the PD chip 21 relative to the stem 23 is similar to that in the PD module 20 described above.

According to the PD module 80 of the TO (CAN) type, because an area for joining the metal case 81 to the stem 23 is required, the diameter of the stem 23 tends to become large. Therefore, for size reduction of the photodetector 10, it may be possible to use the PD module 20 of the potting type.

[Second Modified Example]

Figure 6:
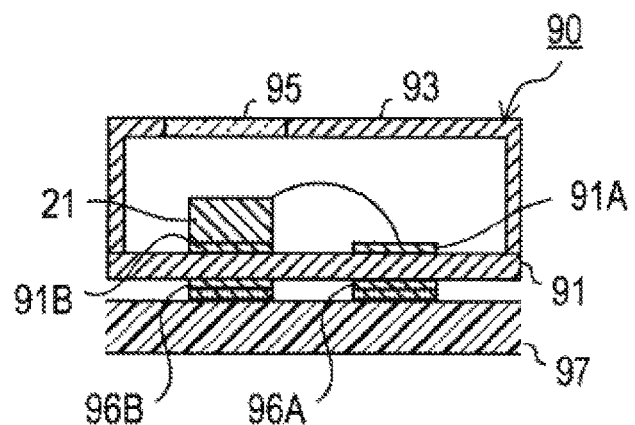
FIG. 6 A cross-sectional view representing a schematic configuration of a PD module of a second modified example.

In the photodetector 10, instead of the PD module 20, a PD module 90 of a front-surface-mounting type illustrated in FIG. 6 may be mounted. The PD module 90 is made to be of a configuration where the PD chip 21 is mounted on a disk-shaped stem 91 configured as a substrate for front-surface-mounting patterned with electrode pads 91A, 91B. The stem 91 has on a front surface thereof an anode electrode pad 91A and a cathode electrode pad 91B. The PD chip 21 is mounted on the cathode electrode pad 91B so the cathode electrode of the PD chip 21 is connected to the cathode electrode pad 91B. The anode electrode pad 91A is wire-bonded to the anode electrode of the PD chip 21.

The electrode pads 91A, 91B of the stem 91 are respectively electrically connected to lands 96A, 96B for front-surface-mounting—corresponding to each electrode pad 91A, 91B—provided on a rear surface of the stem 91 via a through hole that is not illustrated.

On a front surface of the stem 91, a metal case 93 that covers the PD chip 21 is disposed. Similarly to the PD module 80 of the first modified example, the metal case 93 has an opening portion in the path of the input light to the PD chip 21. The opening portion is sealed by a transparent material 95. The PD module 90 configured in this manner is front-surface-mounted on a submount substrate 97 via the lands 96A, 96B of the rear surface of the stem 91.

[Other]

Illustrative embodiments of the present invention are described above, but the present invention is not limited to the embodiments above and may adopt various aspects. For example, the photodetector 10 is not limited to use in an optical communication device. The GRIN lens 40 may be replaced with another collimating lens. For example, the GRIN lens 40 may be replaced with an aspherical lens. It is needless to say that the art of the present disclosure is not limited to the illustrative dimensions described above and can be applied to photodetectors of various dimensions.

A function had by one component in the embodiments above may be provided dispersed between a plurality of components. A function had by a plurality of components may be integrated into one component. A portion of the configuration of the embodiments above may be omitted. At least a portion of the configuration of an embodiment above may be added to or replace the configuration of another embodiment above. All aspects included within the technical idea specified from the wording given in the scope of patent claims are embodiments of the present invention.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

1 . . . optical communication device; 10 . . . photodetector; 20 . . . PD module; 21 . . . PD chip; 21A . . . light-receiving surface; 21B . . . anode electrode; 23 . . . stem; 23A . . . electrode pin; 23B . . . electrode pin; 25 . . . transparent resin layer; 30 . . . optical fiber pigtail; 31A, 31B . . . optical fiber; 33 . . . capillary; 40 . . . GRIN lens; 40A . . . branching membrane; 60 . . . tubular case; 61 . . . first component; 62 . . . second component; 63 . . . third component; 80 . . . PD module; 81 . . . metal case; 83 . . . transparent material; 90 . . . PD module; 91 . . . stem; 91A, 91B . . . electrode pad; 93 . . . metal case; 95 . . . transparent material; 96A, 96B . . . land; C . . . centerline; L, L1, L2 . . . optical transmission line.

What is claimed is:

1. A detection device that detects a power of an input light, comprising:
   a light-receiving module including a light-receiving element and a stem that supports the light-receiving element and forms a signal line from the light-receiving element;
   an optical fiber pigtail that includes two optical fibers, connected to an optical transmission line, and a capillary supporting one end of the two optical fibers, one end of the two optical fibers being supported along an axis of the capillary;
   a lens that collimates the input light from one end of one of the two optical fibers, guides a portion of the input light to the light-receiving element, separates the input light into a transmitted light and a reflected light, guides the transmitted light to the light-receiving element, and guides the reflected light as output to the other of the two optical fibers; and
   a tubular holding body that holds the light-receiving module, the optical fiber pigtail, and the lens; wherein
   the light-receiving element has a center of a light-receiving surface thereof disposed in a position away from an axis of the stem and outputs an electrical signal according to the power of the input light received in the position,
   wherein the axes of the light-receiving module, the optical fiber pigtail, and the lens lie along the same centerline,
   wherein the light-receiving element has the center of the light-receiving surface thereof disposed in the position away from the axis of the stem, which lies along the centerline, and
   wherein an outermost diameter of the light-receiving module is no more than 2.45 mm.

2. The detection device according to claim 1, wherein the light-receiving element has the center of the light-receiving surface thereof disposed in a position overlapping a center of the input light.

3. The detection device according to claim 1, wherein the light-receiving module is no less than a diameter of the optical fiber pigtail and the lens.

4. The detection device according to claim 1, wherein the light-receiving module comprises an electrode pin penetrating the stem,
   the light-receiving element in the form of a chip is mounted as the light-receiving element on the electrode pin on a front surface of the stem, and
   the light-receiving element is covered by a potting material.

5. The detection device according to claim 1, wherein the light-receiving element in the form of a chip is mounted as the light-receiving element on a substrate for front-surface-mounting as the stem.

6. The detection device according to claim 1, wherein the two optical fibers have a bending radius of no more than 10 mm.

7. The detection device according to claim 1, wherein the two optical fibers have a cladding outer diameter of no more than 125 μm.

8. The detection device according to claim 1, wherein an outermost diameter of the light-receiving module is no more than 1.3 mm.

* * * * *